(12) United States Patent
Fukushima

(10) Patent No.: US 8,193,063 B2
(45) Date of Patent: Jun. 5, 2012

(54) METHOD OF MANUFACTURING SEMICONDUCTOR DEVICE

(75) Inventor: Yoichi Fukushima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 193 days.

(21) Appl. No.: 12/796,265

(22) Filed: Jun. 8, 2010

(65) Prior Publication Data

US 2010/0323484 A1    Dec. 23, 2010

(30) Foreign Application Priority Data

Jun. 18, 2009 (JP) ................................. 2009-145326

(51) Int. Cl.
*H01L 21/8234* (2006.01)
(52) U.S. Cl. ........................................................ 438/275
(58) Field of Classification Search ........................ None
See application file for complete search history.

(56) References Cited

FOREIGN PATENT DOCUMENTS

| JP | 05-102428 | 4/1993 |
|---|---|---|
| JP | 11-097649 | 4/1999 |
| JP | 2000-232076 | 8/2000 |
| JP | 2003-282823 | 10/2003 |
| JP | 2005-136434 | 5/2005 |

*Primary Examiner* — Scott B Geyer
(74) *Attorney, Agent, or Firm* — Young & Thompson

(57) ABSTRACT

A method of manufacturing a semiconductor device may include, but is not limited to the following processes. First and second gate electrodes are formed over a semiconductor substrate. An epitaxial layer is selectively formed over the semiconductor substrate. The epitaxial layer is adjacent to the first gate electrode. A first impurity is introduced into the semiconductor substrate through the epitaxial layer to form a first impurity region and directly into the semiconductor substrate to form a second impurity region. The first and second impurity regions are adjacent to the first and second gate electrodes, respectively. The first impurity region includes the epitaxial layer. A first bottom surface of the first impurity region is shallower in level than a second bottom surface of the second impurity region.

20 Claims, 6 Drawing Sheets

US 8,193,063 B2

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No. 2009-145326, filed Jun. 18, 2009, the content of which is incorporated herein by reference.

2. Description of the Related Art

Conventionally, LSI (Large Scale Integration) circuits have been used for main parts of computers, electronic devices, and the like. In an LSI circuit, multiple MOS transistors, resistors, and the like are integrated on a chip. Since LSI circuits are used for various purposes, diverse product demand has been required to be satisfied especially for embedded DRAM (Dynamic Random Access Memory) to be provided on an LSI circuit.

To satisfy the diverse product demand, Japanese Patent Laid-Open Publication No. H05-102428 discloses a method of manufacturing a semiconductor device including a memory cell portion and a peripheral cell portion which have different widths of LDD (Lightly Doped Drain) regions. Japanese Patent Laid-Open Publication No. 2005-136434 discloses a method of siliciding only a peripheral circuit region requiring a high-speed operation. As a method of changing memory cell performance, Japanese Patent Laid-Open Publication No. 2003-282823 discloses a method of forming a high-voltage portion, a peripheral cell portion, and a memory cell portion, which have different transistor structures.

Japanese Patent Laid-Open Publication No. H11-097649 discloses a method of selectively forming a silicide layer in order to prevent refresh defects. As a method of forming different transistor structures on a semiconductor substrate, Japanese Patent Laid-Open Publication No, 2000-232076 discloses a method of forming a silicide layer only for a gate electrode requiring a high-speed operation, and of embedding both a normal transistor structure and an elevated source-and-drain structure on a semiconductor substrate.

Not only diversification, but also miniaturization are required for LSI circuits, especially for DRAM. However, the method of selectively forming a silicide layer when forming a contact plug for a MOS transistor is likely to cause an increase in junction leakage. This is because a silicide layer, which is close to a main surface of a semiconductor substrate, has defects, and therefore junction leakage is likely to increase if an edge of the silicide layer becomes close to an edge of a PN junction. For this reason, a contact plug for the MOS transistor has had to be distanced in the gate-length direction from the edge of the PN junction in an impurity diffusion region formed in the semiconductor substrate, in plan view. In other words, a contract plug for a MOS transistor has had to be distanced from a sidewall layer covering a sidewall of a gate electrode, thereby requiring a gate length, and therefore preventing miniaturization of semiconductor devices.

To prevent the increase in junction leakage, i.e., the short channel effect, a MOS transistor having an elevated source-and-drain structure is effective. A MOS transistor having the elevated source-and-drain structure is formed by forming an impurity diffusion region in a silicide layer (epitaxial growth layer) and thus forming a doped epitaxial growth layer. Since the impurity diffusion region is formed in the doped epitaxial growth layer, the depth of the impurity diffusion region adjacent to the main surface of the semiconductor substrate can be reduced more than in the case of a normal MOS transistor. For this reason, the MOS transistor having the elevated source-and-drain structure can decrease the gate length while preventing the short channel effect.

However, regarding the MOS transistor having the elevated source-and-drain structure, the silicide layer (epitaxial growth layer), which includes the impurity diffusion region, is positioned higher in level than a main surface of the semiconductor substrate. For this reason, parasitic capacitance between the impurity diffusion region and the gate electrode is greater than that of a MOS transistor having a normal structure. Therefore, high-frequency response characteristics of the MOS transistor having the elevated source-and-drain structure is likely to degrade compared to that of the MOS transistor having the normal structure.

Further, the method of embedding both a MOS transistor having the normal structure and a MOS transistor having the elevated source-and-drain structure in a semiconductor substrate complicates the manufacturing processes.

SUMMARY

In one embodiment, a method of manufacturing a semiconductor device may include, but is not limited to the following processes. First and second gate electrodes are formed over a semiconductor substrate. An epitaxial layer is selectively formed over the semiconductor substrate. The epitaxial layer is adjacent to the first gate electrode. A first impurity is introduced into the semiconductor substrate through the epitaxial layer to form a first impurity region and directly into the semiconductor substrate to form a second impurity region. The first and second impurity regions are adjacent to the first and second gate electrodes, respectively. The first impurity region includes the epitaxial layer. A first bottom surface of the first impurity region is shallower in level than a second bottom surface of the second impurity region.

In another embodiment, a method of manufacturing a semiconductor device may include, but it not limited to the following processes. First and second gate electrodes are formed over a semiconductor substrate. A first insulating layer is covered so as to cover the first and second gate electrodes and the semiconductor substrate. First and second portions of the first insulating layer are removed. The first portion covers a first top surface of the first gate electrode. The second portion covers a part of the semiconductor substrate. The second portion is adjacent to the first gate electrode. An epitaxial layer is selectively formed over the semiconductor substrate that is exposed by removing the second portion. The epitaxial layer is adjacent to the first gate electrode. A second insulating layer is formed so as to cover the first insulating layer, the first portion, and the epitaxial layer. A third portion of a stack of the first and second insulating layers is removed. The third portion covers a second top surface of the second gate electrode. A fourth portion of the second insulating layer is removed. The fourth portion covers the first gate electrode and the epitaxial layer. A first impurity is introduced into the semiconductor substrate through the epitaxial layer to form a first impurity region and directly into the semiconductor substrate to form a second impurity region. The first and second impurity regions are adjacent to the first and second gate electrodes, respectively. The first impurity region includes the epitaxial layer.

In still another embodiment, a method of forming a semiconductor device may include, but is not limited to the following processes. First and second gate electrodes are formed over a semiconductor substrate. First and second insulating layers are formed so as to cover first and second top surfaces of the first and second gate electrodes, respectively. A third insulating layer is formed so as to cover the first and second insulating layers, first and second side surfaces of the first and second electrodes, respectively, and the semiconductor substrate. The third insulating layer is selectively removed while having first and second portions of the third insulating layer remain. The first and second portions cover the first and second side surfaces of the first and second gate electrodes, respectively. An epitaxial layer is selectively formed over the semiconductor substrate. The epitaxial layer is adjacent to the first portion. An impurity is introduced into the semiconductor substrate through the epitaxial layer to form a first impurity region and directly into the semiconductor substrate to form a second impurity region. The first and second impurity regions are adjacent to the first and second gate electrodes, respectively. The first impurity region includes the epitaxial layer. First and second contact plugs are formed so as to connect to the first and second impurity regions, respectively, while the first insulating layer and the first portion cover the first gate electrode, and the second insulating layer and the second portion cover the second gate electrode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
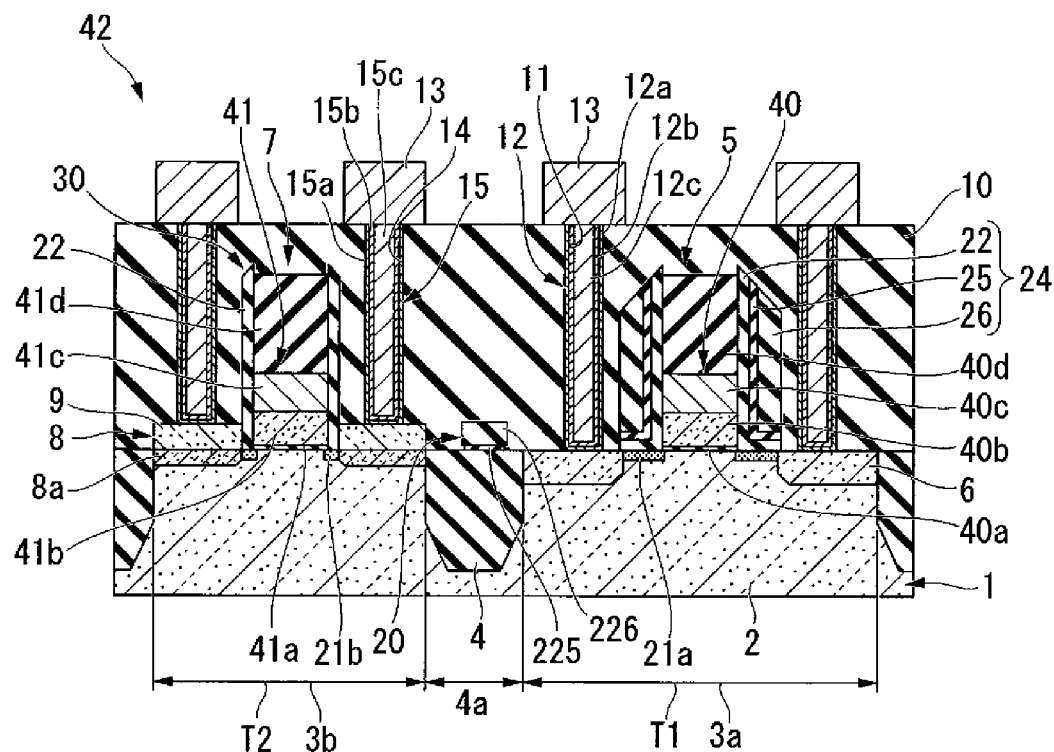
FIG. 1 is a cross-sectional view illustrating a semiconductor device according to a first embodiment of the present invention.

FIG. 1 is a cross-sectional view illustrating a semiconductor device 42 according to a first embodiment of the present invention. The semiconductor device 42 schematically includes first and second MOS transistors 5 and 7.

A semiconductor substrate 1 and the first and second MOS transistors 5 and 7 are covered by an inter-layer insulating film 10. First and second contact plugs 12 and 15 are formed in the inter-layer insulating film 10. The first contact plug 12 penetrates the inter-layer insulating film 10 and connects to a first impurity diffusion region 6. The second contact plug 15 penetrates the inter-layer insulating film 10 and connects to a second impurity diffusion region 8. Wires 13 are provided on the inter-layer insulating film 10 so as to connect to the first and second contact plugs 12 and 15.

In the first embodiment, a silicon substrate is used as the semiconductor substrate 1. However, the semiconductor substrate 1 is not limited to the silicon substrate, and a germanium substrate and the like may be used. A p-type well region 2 is formed in the semiconductor substrate 1. The p-type well region 2 includes first and second active regions 3a and 3b. The first and second active regions 3a and 3b are isolated from each other by an element isolation region 4a made of an embedded insulating film 4. The first and second MOS transistors 5 and 7 are disposed in the active regions 3a and 3b, respectively. The horizontal width T2 of the active region 3b is smaller than the horizontal width T1 of the active region 3a.

The first MOS transistor 5 is formed on the semiconductor substrate 1. The first MOS transistor 5 includes: a gate insulating film 40a; a first gate electrode 40 formed on the gate insulating film 40a; a first sidewall layer 24 covering a side surface of the first gate electrode 40; and the first impurity diffusion region 6 and a first LDD region 21a which are formed in the semiconductor substrate 1.

The first gate electrode 40 includes a DOPOS film 40b and a multi-layered film 40c. The multi-layered film 40c includes a barrier metal film and a tungsten film, which are patterned. A mask nitride film 40d is deposited on the multi-layered film 40c.

The sidewall layer 24, which is formed on the side surface of the first gate electrode 40, includes a first nitride film 22, a second nitride film 25, and a sidewall oxide film 26. The second nitride film 25 covers the first nitride film 22. The sidewall oxide film 26 covers the second nitride film 25. Preferably, the first nitride film 22, the second nitride film 25, and the sidewall oxide film 26 have thicknesses of, for example, 20 nm, 5 nm, and 50 nm, respectively.

The first impurity diffusion region 6 is formed on either side of the first gate electrode 40. The first impurity diffusion region 6 extends from the main surface of the semiconductor substrate 1 and reaches the active region 3a. A bottom surface of the first LDD region 21a is higher in level then a bottom surface of the first impurity diffusion region 6. The impurity concentration of the first LDD region 21a is smaller than that of the first impurity diffusion region 6.

The second MOS transistor 7 is formed on the semiconductor substrate 1. The second MOS transistor 7 includes: a gate insulating film 41a; a second gate electrode 41 formed on the gate insulating film 41a; a second sidewall layer 30 formed on a side surface of the second gate electrode 41; and a second impurity diffusion region 8 and a second LDD region 21b which are formed in the semiconductor substrate 1.

The second gate electrode 41 includes a DOPOS film 41b and a multi-layered film 41c. The multi-layered film 41c includes a barrier metal film and a tungsten film which are patterned. A mask nitride film 41d is deposited on the multi-layered film 41c.

The second sidewall layer 30, which is formed on the side surface of the second gate electrode 41, includes the first nitride film 22. The first nitride film 22 covering the first gate electrodes 40 is divided and becomes the second sidewall layer 30. Preferably, the thickness of the first nitride film 22 is, but is not limited to, for example, 20 nm.

The second sidewall layer 30 is smaller in thickness than the first sidewall layer 24. In other words, the second sidewall layer 30 does not include the second nitride film 25 and the sidewall oxide film 26 as the first sidewall layer 24 does. Therefore, the difference in thickness between the first and second sidewall layers 24 and 30 is the thicknesses of the second nitride film 25 and the sidewall oxide film 26.

A doped epitaxial growth layer 9 is formed on either side of the second gate electrode 41. An impurity atom, which is a dopant, is diffused in the doped epitaxial growth layer 9.

Preferably, the impurity atom is, for example, As. The impurity atom diffusing in the doped epitaxial growth layer 9 diffuses to the semiconductor substrate 1 under the doped epitaxial growth layer 9. The impurity atom, which diffuses in the doped epitaxial growth layer 9 and in the semiconductor substrate 1, forms the second impurity diffusion region 8. A bottom surface of the second impurity diffusion region 8 is higher in level than a bottom surface of the first impurity diffusion region 6. The impurity concentration of the second LDD region 21b is smaller than that of the second impurity diffusion region 8.

The inter-layer insulating film 10 is formed so as to cover the semiconductor substrate 1 and the first and second MOS transistors 5 and 7. The first and second contact holes 11 and 14 are formed in the inter-layer insulating film 10. The first and second contact plugs 12 and 15 are formed in the first and second contact holes 11 and 14, respectively.

The first contact hole 11 penetrates the inter-layer insulating film 10 so as to expose the upper surface of the first impurity diffusion region 6. The first contact plug 12 is formed in the first contact hole 11 so as to extend to the upper surface of the inter-layer insulating film 10. The first contact plug 12 includes, but is not limited to, a titanium film 12a, a titanium nitride film 12b, and a tungsten film 12c.

The second contact hole 14 penetrates the inter-layer insulating film 10 so as to expose the upper surface of the doped epitaxial growth layer 9. The second contact plug 15 is formed in the second contact hole 14 so as to extend to the upper surface of the inter-layer insulating film 10. The second contact plug 15 includes, but is not limited to, a titanium film 15a, a titanium nitride film 15b, and a tungsten film 15c. The first and second contact plugs 12 and 15 are connected to the wires 13 on the inter-layer insulating films 10.

The semiconductor device 42 of the first embodiment includes the first and second MOS transistors 5 and 7 which are formed on the same semiconductor substrate 1. The first MOS transistor 5 achieves a high-speed operation. The second MOS transistor 7 achieves a reduction in pitch. The first and second MOS transistors 5 and 7 having different structures are formed on the same semiconductor substrate 1, thereby achieving miniaturization and diversification of DRAM.

Hereinafter, a method of manufacturing the semiconductor device 42 according to the first embodiment is explained with reference to FIGS. 2 to 12. The method of the first embodiment includes: a process of forming the first and second gate electrodes 40 and 41; a process of forming a first insulating layer (first nitride film 122) covering the second gate electrode 41 and thus forming the second sidewall layer 30; a process of forming an epitaxial growth layer 9a on either side of the second gate electrode 41; a process of forming a second insulating layer (second nitride film 125) and a third insulating layer (sidewall oxide film 126) which cover the first gate electrode 40, thus forming the first sidewall layer 24; and a process of forming the first and second impurity diffusion regions 6 and 8. Hereinafter, each process is explained in detail.

Figure 2:
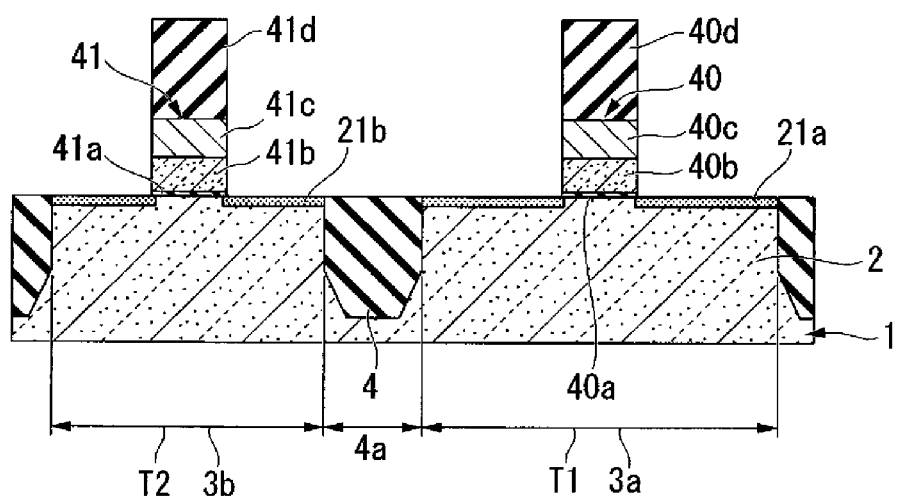
FIGS. 2 to 12 are cross-sectional views indicative of a process flow illustrating a method of manufacturing the semiconductor device according to the first embodiment.

In the process of forming the first and second gate electrodes 40 and 41, the p-type well region 2 is formed in the semiconductor substrate 1, as shown in FIG. 2. Then, the first and second active regions 3a and 3b and the element isolation region 4a are formed in the p-type well region 2. The first and second gate electrodes 40 and 41 are formed in the first and second active regions 3a and 3b, respectively. The horizontal width T2 of the second active region 3b is smaller than the horizontal width T1 of the first active region 3a.

Then, the first and second gate electrodes 40 and 41 are formed. Firstly, the gate insulating film 40a, a poly-silicon film, a barrier metal film, a tungsten film, and the mask nitride film 40d are sequentially deposited in this order. Then, these films are patterned by photolithography and etching, thus forming the first and second gate electrodes 40 and 41. The first gate electrode 40 includes the DOPOS film 40b, the multi-layered film 40c, and the mask nitride film 40d. The second gate electrode 41 includes the DOPOS film 41b, the multi-layered film 41c, and the mask nitride film 41d.

Then, p-type implantation is carried out by self-alignment with respect to the semiconductor substrate 1 and the first and second gate electrodes 40 and 41 to form a third impurity diffusion region (first and second LDD regions 21a and 21b). The p-type implantation is carried out at an energy of 10 KeV at a dose of $1.5 \times 10^{13}$ atoms/cm$^2$.

Figure 3:
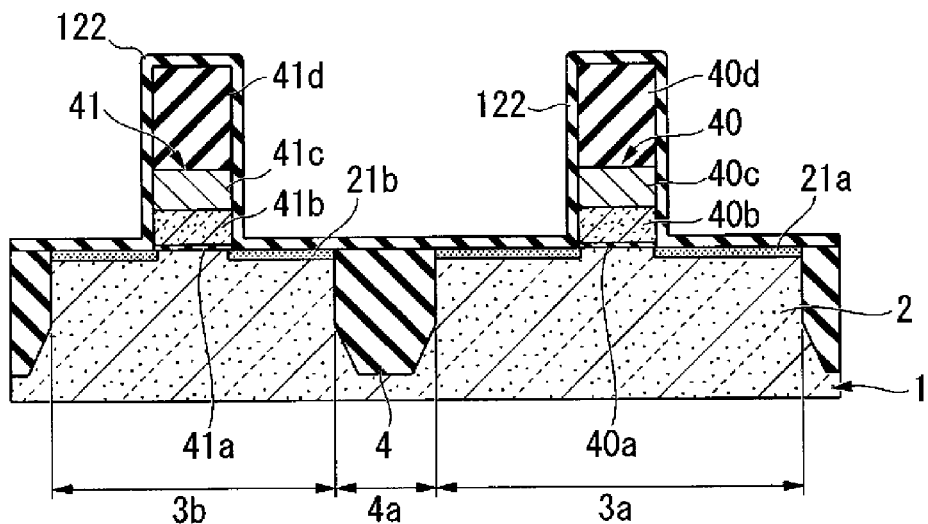

In the next process of forming the second sidewall layer 30, the first insulating layer (first nitride film 122) is formed so as to cover the first and second gate electrodes 40 and 41, as shown in FIG. 3. Preferably, a thickness of the first insulating layer (first nitride film 122) is, for example, 20 nm.

Figure 4:
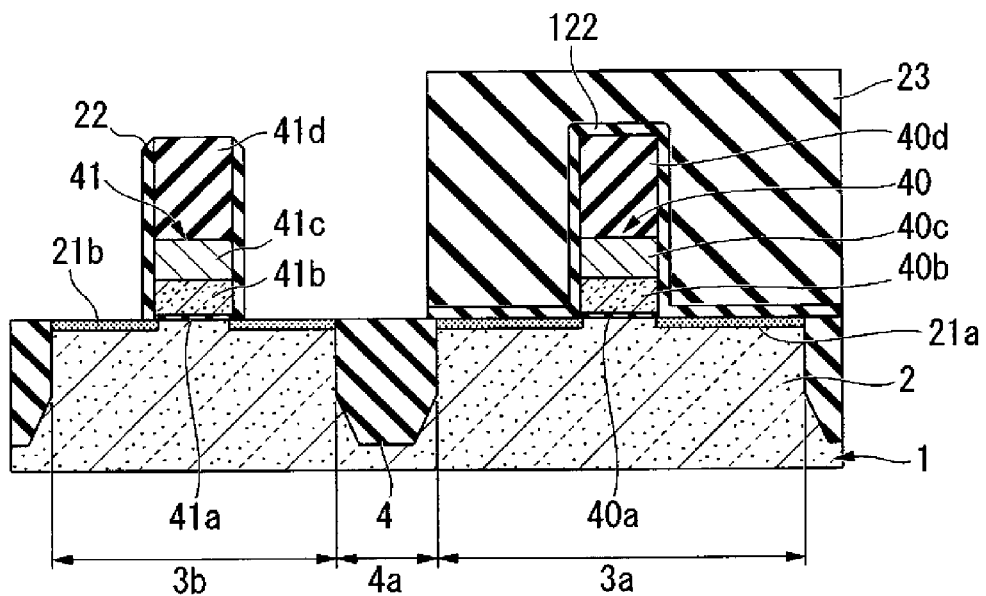

Then, a first resist mask 23 is formed, and then the first insulating layer (first nitride film 122) is etched back, as shown in FIG. 4. The first resist mask 23 is formed so as to cover the first insulating layer (first nitride film 122) while the second gate electrode 41 is not covered by the first resist mask 23. Then, the first insulating layer (first nitride film 122) on the side of the second gate electrode 41 is etched back so as to expose the second LDD region 21b. Consequently, the second sidewall layer 30, which includes the first nitride film 22, is formed so as to cover the sidewall of the second electrode 41.

Figure 5:
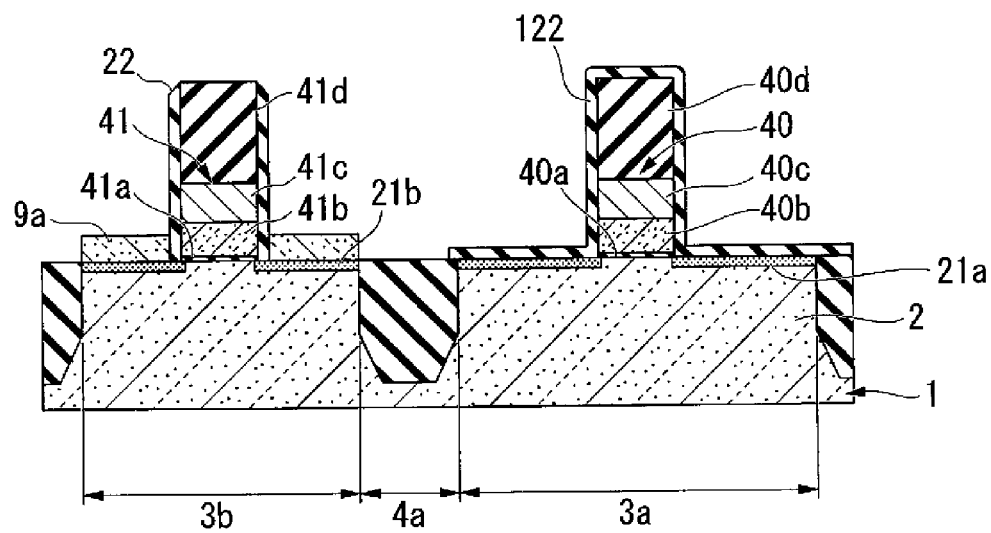

In the next process of forming the epitaxial growth layer 9a, the epitaxial growth layer 9a is formed adjacent to the second gate electrode 41, as shown in FIG. 5. Firstly, the first resist mask 23 is removed. Then, a silicon film is formed on the semiconductor substrate 1 by selective epitaxial growth such that the silicon film is positioned on either side of the gate electrode 41, thereby forming the epitaxial growth layer 9a.

Figure 6:
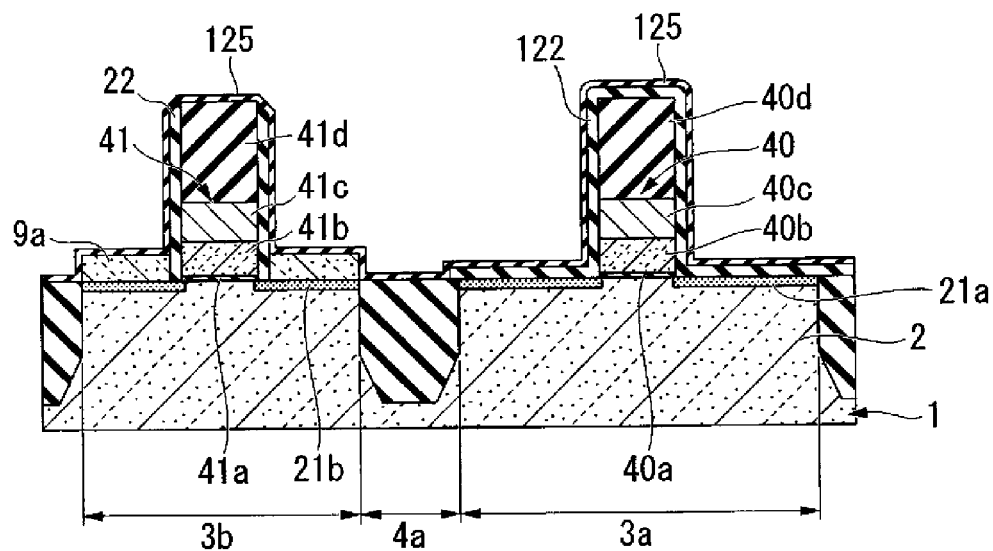

In the next process of forming the first sidewall layer 24, the second insulating layer (second nitride film 125) is formed so as to cover the semiconductor substrate 1 and the first and second gate electrodes 40 and 41, as shown in FIG. 6. Preferably, a thickness of the second insulating film (second insulating film 125) is, for example, 5 nm.

Figure 7:
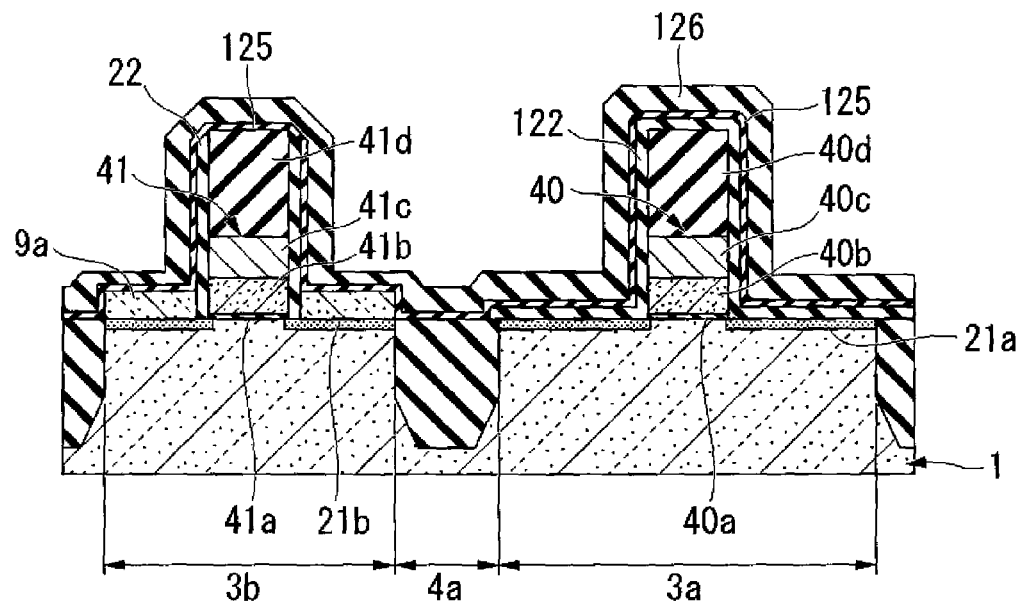

Then, the third insulating layer (sidewall oxide film 126) is formed so as to cover the second insulating layer (second nitride film 125), as shown in FIG. 7. Preferably, a thickness of the third insulating layer (sidewall oxide film 126) is, for example, 50 nm.

Figure 8:
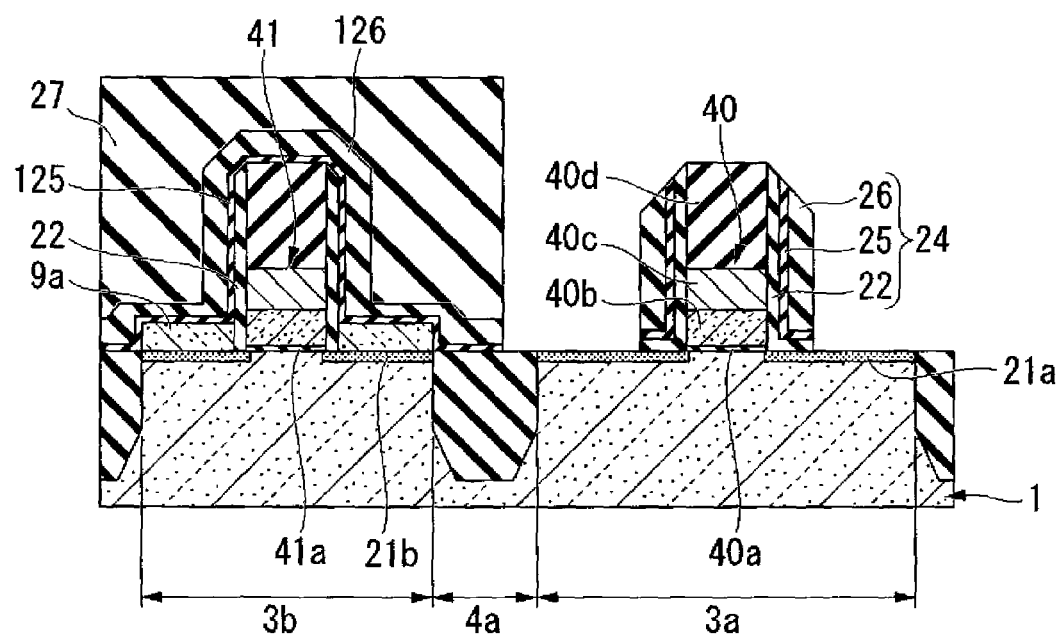

Then, a second resist mask 27 is formed, and then the third insulating layer (sidewall oxide film 126) is etched back, as shown in FIG. 8. Firstly, the second resist mask 27 is formed so as to cover the second insulating layer (second nitride film 125) so as to cover the second gate electrode 41 while the first gate electrode 40 is not covered by the second insulating layer. Then, the second insulating layer (second nitride film 125) is etched back using the second resist mask 27 so as to expose the first LDD region 21a. Then, the sidewall layer 24, which includes the sidewall oxide film 26, the second nitride film 25, and the first nitride film 22, is formed so as to cover the sidewall of the first gate electrode 40.

Figure 9:
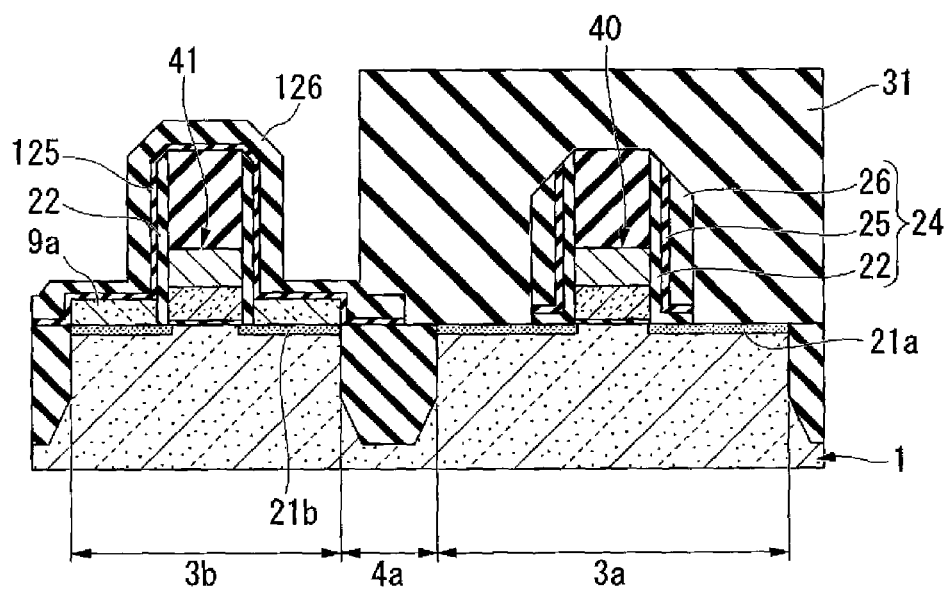
Figure 10:
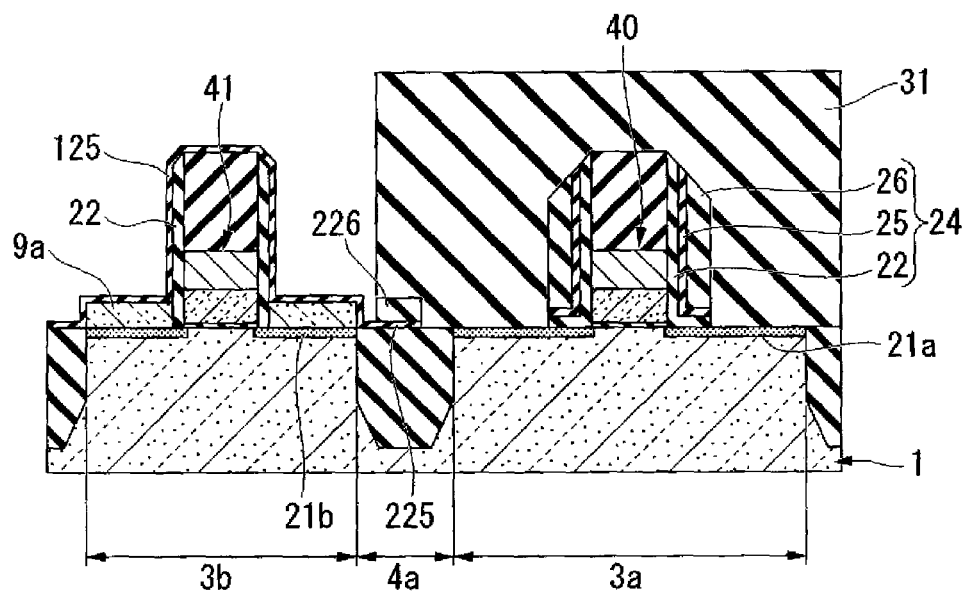

Then, a third resist mask 31 is formed to etch back the third insulating layer (sidewall oxide film 126), as shown in FIGS. 9 and 10. Firstly, the second resist mask 27 is removed. Then, the third resist mask 31 is formed so as to cover the first gate electrode 40 while the second gate electrode 41 is not covered by the third resist mask 31. Then, the third insulating layer (sidewall oxide film 126) is etched back using the third resist mask 31 so as to expose the second insulating layer (second nitride film 125) on the side of the second gate electrode 41. This etching is carried out with selectivity to the sidewall oxide film 126. Preferably, this etching is carried out by, for example, wet etching with an HF solution.

Figure 11:
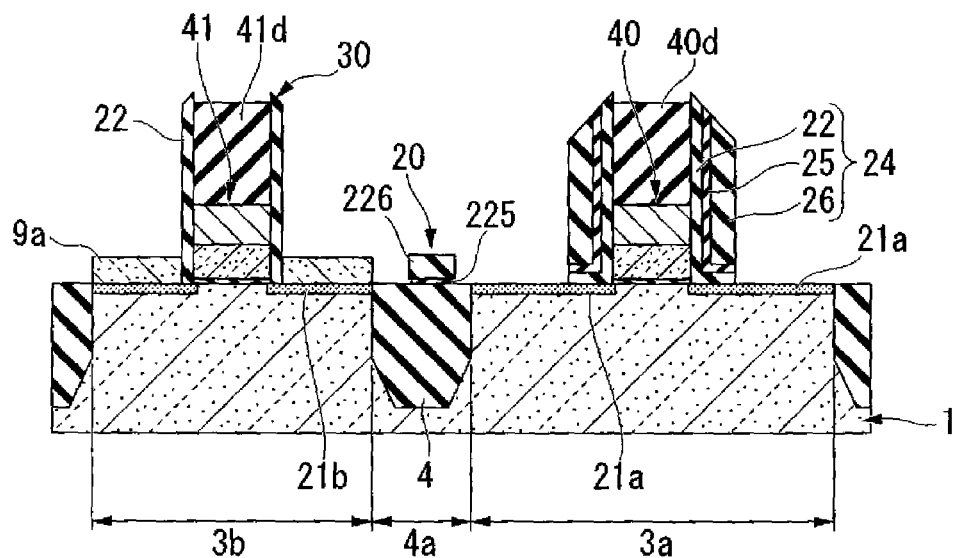

Then, the second insulating layer (second nitride film 125) is etched back as shown in FIG. 11. Firstly, the third resist mask 31 is removed. Then, the second insulating layer (second nitride film 125) is etched back. Preferably, this etching is carried by, for example, wet etching with a phosphorus solution. In this process, upper surfaces of the mask nitride films 40d and 41d of the first and second gate electrodes 40 and 41 are slightly etched. In this case, the second insulating layer (second nitride film 125) is not necessarily removed. An insulator 20 is formed at a region where the second resist mask 27 overlaps the third resist mask 31. The insulator 20 includes the second insulating layer (second nitride film 225) and the third insulating layer (sidewall oxide film 226). The insulator 20 causes no problem with the device.

Figure 12:
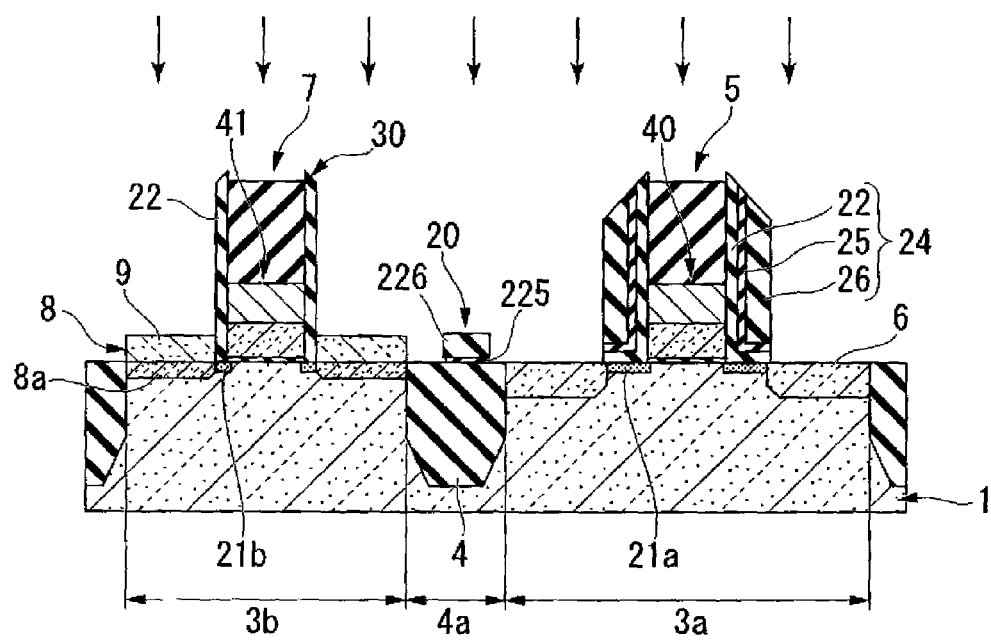

In the next process of forming the first and second impurity diffusion regions 6 and 8, an impurity atom is diffused in the first LDD region 21a and the epitaxial growth layer 9a, as shown in FIG. 12. For example, As is preferably used as the impurity atom. Diffusion of the impurity atom in the first LDD region 21a causes formation of the first impurity diffusion region 6. Diffusion of the impurity atom in the epitaxial growth layer 9a causes formation of the doped epitaxial growth layer 9. The impurity atom is further diffused to the semiconductor substrate 1 under the doped epitaxial growth layer 9, and thereby a lower diffusion region 8a is formed. The doped epitaxial growth layer 9 and the lower diffusion region 8a form the second impurity diffusion region 8. The lower surface of the lower diffusion region 8a is higher in level than the lower surface of the first impurity diffusion region 6.

Then, As (Arsenic) is implanted as shown in FIG. 12. This implantation is carried out at an energy of 20 KeV, at a dose of $2 \times 10^{15}$ atoms/cm$^2$. The As concentration of the first and second impurity diffusion regions 6 and 8 are greater than that of the third impurity diffusion region (first and second LDD regions 21a and 21b). By the above processes, the first and second MOS transistors 5 and 7 are formed on the semiconductor substrate 1.

Then, the inter-layer insulating film 10 is formed so as to cover the semiconductor substrate 1 and the first and second MOS transistors 5 and 7. Then, the first and second contact holes 11 and 14 are formed in the inter-layer insulating film 10. The first contact hole 11 penetrates the inter-layer insulating film 10 so as to expose the upper surface of the first impurity diffusion region 6. The second contact hole 14 penetrates the inter-layer insulating film 10 so as to expose the upper surface of the doped epitaxial growth layer 9.

Then, the first contact plugs 12 and 15 are formed in the first and second contact holes 11 and 14, respectively. Firstly, the titanium film 12a is formed so as to cover the inner surface of the first contact hole 11. Then, the titanium nitride film 12b is formed so as to cover the titanium film 12a. Similarly, the titanium film 15a is formed so as to cover the inner surface of the second contact hole 14. Then, the titanium nitride film 15b is formed so as to cover the titanium film 15a. Then, an annealing process is carried out to silicide the titanium film 12a and the titanium film 15a with a silicon film. Consequently, a reaction between the titanium film 12a and the silicon film causes formation of a silicide layer on a bottom portion of the first contact hole 11. Similarly, a reaction between the titanium film 15a and the silicon film causes formation of a silicide layer on a bottom portion of the second contact hole 14. The formation of the silicide layers enables the contact resistance to be halved and stabilized.

Then, the tungsten film 12c is formed in the first contact hole 11 so as to cover the titanium nitride film 12b. Similarly, the tungsten film 15c is formed in the second contact hole 14 so as to cover the titanium nitride film 15b. Films to be formed in the first and second holes 11 and 14 are not limited to the tungsten films 12c and 15c.

Then, the titanium film 12a, the titanium nitride film 12b, and the tungsten film 12c, which are formed in the first contact hole 11, are polished by CMP (Chemical Vapor Deposition). Similarly, the titanium film 15a, the titanium nitride film 15b, and the tungsten film 15c, which are formed in the second contact hole 14, are polished by CMP. Consequently, the first and second contact plugs 12 and 15 are formed in the first and second contact holes 11 and 14, respectively. Then, the wires 13, which are connected to the first and second contact plugs 12 and 15, are formed on the inter-layer insulating film 10. In this manner, the semiconductor device 42 as shown in FIG. 1 is formed.

According to the manufacturing method of the first embodiment, the thick first and second sidewall layers 24 and 30 can be formed by one process. Additionally, the second impurity diffusion region 8 is formed by diffusing an impurity in the epitaxial growth layer 9a. For this reason, the bottom surface of the second impurity diffusion region 8a can be higher in level than the bottom surface of the first impurity diffusion region 6 by one impurity diffusion process. Therefore, the gate length of the second MOS transistor 7 can be shorter than that of the first MOS transistor 5.

Further, the horizontal width of the active region 3b on the side of the second MOS transistor 7 can be smaller than the horizontal width of the active region 3b on the side of the first MOS transistor 5. For this reason, the second MOS transistors 7 can be formed at a narrower pitch than a pitch at which the first MOS transistors 5 are formed.

Moreover, the first and second contact holes 11 and 14 can be formed by one process. Additionally, the first and second contact plugs 12 and 15 can be formed by one process. Regarding the second MOS transistor 7, the upper and side surfaces of the second gate electrode 41 are covered by the mask nitride film 41d and the first nitride film 22, respectively. For this reason, the second contact holes 14 can be formed by self-alignment with respect to the second gate electrode 41. Therefore, the distance between the second gate electrode 41 and the second contact hole 14 can be reduced to the thickness of the first nitride film 22.

According to the first embodiment, the first MOS transistor achieving a high-speed operation and the second MOS transistor 7 achieving a reduced pitch can be efficiently formed on the semiconductor substrate 1 by the same process. For this reason, a fast-and-miniaturized semiconductor device 42 can be formed, thereby achieving miniaturization and diversification of DRAM.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, but may be modified and changed without departing from the scope and spirit of the invention.

For example, in one embodiment, a semiconductor device may include, but is not limited to: first and second gate electrodes over a semiconductor substrate; first and second insulating layers covering first and second side surfaces of the first and second gate electrodes, respectively; and first and second impurity regions adjacent to the first and second insulating layers, respectively. A first upper surface of the first impurity region is higher in level than a main surface of the semiconductor substrate. A first bottom surface of the first impurity region is lower in level than the main surface of the semiconductor substrate. The second impurity region is included in the semiconductor substrate. The second impurity region is adjacent to the main surface of the semiconductor substrate. A second bottom surface of the second impurity region is lower in level than the first bottom surface of the first impurity region.

Regarding the above semiconductor device, the first impurity region may include an epitaxial layer over the main surface of the semiconductor substrate.

Regarding the above semiconductor device, the second insulating layer is thicker than the first insulating layer.

The above semiconductor device may further include first and second lightly-doped regions in the semiconductor substrate. The first and second lightly-doped regions are under the first and second insulating layers, respectively. The first and second lightly-doped regions are adjacent to the first and second impurity regions, respectively.

Regarding the above semiconductor device, a third bottom surface of the first lightly-doped region is shallower in level than the first bottom surface of the first impurity region. A fourth bottom surface of the second lightly-doped region is shallower in level than the second bottom surface of the second impurity region.

Regarding the above semiconductor device, the first and second impurity regions have first and second impurity concentrations, respectively. The first and second lightly-doped regions have third and fourth impurity concentrations, respectively. The first and second impurity concentrations are greater than the third and fourth impurity concentrations.

The above semiconductor device may further include a third insulating layer covering the first and second gate electrodes, the first and second insulating layers, a part of the first impurity region, and the main surface of the semiconductor substrate.

The above semiconductor device may further include first and second contact plugs penetrating the third insulating layer, the first and second contact plugs connecting to the first and second impurity regions, respectively.

The above semiconductor device may further include first and second wires over the third insulating layer, the first and second wires connecting to the first and second contact plugs, respectively.

Regarding the above semiconductor device, the first impurity region, the first lightly-doped region, the first contact plug, and the first wire may be formed on either side of the first gate electrode. The second impurity region, the second lightly-doped region, the second contact plug, and the second wire may be formed on either side of the second gate electrode.

Regarding the above semiconductor device, third and fourth top surfaces of the first and second insulating layers are sloped such that the third and fourth top surfaces are elevated as the first and second insulating layers are closer to the first and second gate electrodes, respectively.

Regarding the above semiconductor device, the semiconductor substrate may have a first active region and a second active region isolated from the first active region. The first active region includes, in plane view, the first impurity region, the first lightly-doped region, the first contact plug, and the first wire. The second active region includes, in plane view, the second impurity region, the second lightly-doped region, the second contact plug, and the second wire. The first active region is smaller in horizontal width than the second active region.

Regarding the above semiconductor device, the second insulating layer may have a first multi-layered structure.

Regarding the above semiconductor device, the first multi-layered structure includes: a fourth insulating layer covering the second side surface of the second gate electrode; and a fifth insulating layer covering the fourth insulating layer.

Regarding the above semiconductor device, each of the first and second gate electrodes may have a second multi-layered structure.

Regarding the above semiconductor device, the second multi-layered structure includes: a poly-silicon layer over the semiconductor substrate; a metal layer over the poly-silicon layer; a fourth insulating layer over the metal layer.

Regarding the above semiconductor device, each of the first and second contact plugs may have a third multi-layered structure.

Regarding the above semiconductor device, the third multi-layered structure includes: a titanium silicide layer covering an inner surface of each of the first and second contact plugs; a titanium nitride layer covering the titanium silicide layer; and a tungsten layer covering the titanium nitride layer.

What is claimed is:

1. A method of manufacturing a semiconductor device, comprising:
   forming first and second gate electrodes over a semiconductor substrate;
   selectively forming an epitaxial layer over the semiconductor substrate, the epitaxial layer being adjacent to the first gate electrode; and
   introducing a first impurity into the semiconductor substrate through the epitaxial layer to form a first impurity region and directly into the semiconductor substrate to form a second impurity region, the first and second impurity regions being adjacent to the first and second gate electrodes, respectively, the first impurity region comprising the epitaxial layer, and a first bottom surface of the first impurity region being shallower in level than a second bottom surface of the second impurity region.

2. The method according to claim 1, wherein the epitaxial layer is formed by selective epitaxial growth.

3. The method according to claim 1, wherein
   the first impurity region is formed on either side of the first gate electrode, and
   the second impurity region is formed on either side of the second gate electrode.

4. The method according to claim 1, further comprising:
   before forming the epitaxial layer, introducing a second impurity into the semiconductor substrate at a first concentration to form first and second lightly-doped regions adjacent to the first and second gate electrodes, respectively,
   wherein the first impurity is introduced at a second concentration that is greater than the first concentration.

5. A method of manufacturing a semiconductor device, comprising:
    forming first and second gate electrodes over a semiconductor substrate;
    forming a first insulating layer covering the first and second gate electrodes and the semiconductor substrate;
    removing first and second portions of the first insulating layer, the first portion covering a first top surface of the first gate electrode, the second portion covering a part of the semiconductor substrate, and the second portion being adjacent to the first gate electrode;
    selectively forming an epitaxial layer over the semiconductor substrate that is exposed by removing the second portion, the epitaxial layer being adjacent to the first gate electrode;
    forming a second insulating layer covering the first insulating layer, the first portion, and the epitaxial layer;
    removing a third portion of a stack of the first and second insulating layers, the third portion covering a second top surface of the second gate electrode;
    removing a fourth portion of the second insulating layer, the fourth portion covering the first gate electrode and the epitaxial layer; and
    introducing a first impurity into the semiconductor substrate through the epitaxial layer to form a first impurity region and directly into the semiconductor substrate to form a second impurity region, the first and second impurity regions being adjacent to the first and second gate electrodes, respectively, the first impurity region comprising the epitaxial layer.

6. The method according to claim 5, further comprising:
    before forming the first and second gate electrodes, preparing the semiconductor substrate having a first active region and a second active region adjacent to the first active region, the second active region being isolated from the first active region, the first active region is smaller in horizontal width than the second active region,
    wherein the first and second gate electrodes are formed in the first and second active regions, respectively.

7. The method according to claim 5, wherein removing the first and second portions comprising:
    forming a first mask covering a fifth portion of the first insulating layer, the fifth portion covering the second gate electrode;
    etching the first insulating layer using the first mask so as to partially expose the semiconductor substrate; and
    removing the first mask.

8. The method according to claim 5, wherein removing the third portion comprising:
    forming a second mask covering the fourth portion;
    etching the stack of the first and second insulating layers using the second mask; and
    removing the second mask.

9. The method according to claim 5, wherein removing the fourth portion comprising:
    forming a third mask covering the second top surface of the second gate electrode and a sixth portion of the stack of the first and second insulating layers, the sixth portion covering a side surface of the second gate electrode;
    etching the second insulating layer using the third mask; and
    removing the third mask.

10. The method according to claim 5, wherein the epitaxial layer is formed by selective epitaxial growth.

11. The method according to claim 5, wherein the first and second impurity regions are formed such that a first bottom surface of the first impurity region being shallower in level than a second bottom surface of the second impurity region.

12. The method according to claim 5, further comprising:
    after forming the first and second gate electrodes and before forming the first insulating layer, introducing a second impurity into the semiconductor substrate at a first concentration to form first and second lightly-doped regions adjacent to the first and second gate electrodes, respectively,
    wherein the first impurity is introduced at a second concentration that is greater than the first concentration.

13. The method according to claim 12, wherein
    the first impurity region, the epitaxial layer, and the first lightly-doped are formed on either side of the first gate electrode, and
    the second impurity region and the second lightly-doped region are formed on either side of the second gate electrode.

14. A method of forming a semiconductor device, comprising:
    forming first and second gate electrodes over a semiconductor substrate;
    forming first and second insulating layers covering first and second top surfaces of the first and second gate electrodes, respectively;
    forming a third insulating layer covering the first and second insulating layers, first and second side surfaces of the first and second electrodes, respectively, and the semiconductor substrate;
    selectively removing the third insulating layer while having first and second portions of the third insulating layer remain, the first and second portions covering the first and second side surfaces of the first and second gate electrodes, respectively;
    selectively forming an epitaxial layer over the semiconductor substrate, the epitaxial layer being adjacent to the first portion;
    introducing an impurity into the semiconductor substrate through the epitaxial layer to form a first impurity region and directly into the semiconductor substrate to form a second impurity region, the first and second impurity regions being adjacent to the first and second gate electrodes, respectively, the first impurity region comprising the epitaxial layer; and
    forming first and second contact plugs connecting to the first and second impurity regions, respectively, while the first insulating layer and the first portion cover the first gate electrode, and the second insulating layer and the second portion cover the second gate electrode.

15. The method according to claim 14, wherein forming the first and second contact plugs comprising:
    forming a fourth insulating layer covering the first and second insulating layers, the first and second portions, the epitaxial layer, and the semiconductor substrate; and
    forming first and second contact holes penetrating the fourth insulating layer so as to expose a first top surface of the first impurity region and a second top surface of the second impurity region while the first insulating layer and the first portion cover the first gate electrode, and the second insulating layer and the second portion cover the second gate electrode.

16. The method according to claim 15, wherein forming the first and second contact plugs further comprising:
    forming first and second titanium films covering inner surfaces of the first and second contact holes, respectively;

forming first and second titanium nitride films covering the first and second titanium films, respectively;

performing an annealing process to silicide the first and second titanium films; and forming first and second tungsten films covering the first and second titanium nitride films which are silicided, respectively.

17. The method according to claim 15, further comprising:

forming first and second wires on the fourth insulating layer, the first and second wires being connected to the first and second contact plugs, respectively.

18. The method according to claim 14, wherein the first and second impurity regions are formed such that a first bottom surface of the first impurity region being shallower in level than a second bottom surface of the second impurity region.

19. The method according to claim 14, wherein forming the first and second gate electrodes comprises:

forming a poly-silicon layer over the semiconductor substrate;

forming a metal layer over the poly-silicon layer;

forming the first insulating layer over the metal layer; and patterning a stack of the poly-silicon layer, the metal layer, and the first insulating layer.

20. The method according to claim 14, wherein the first impurity region and the first contact plug are formed on either side of the first gate electrode, and the second impurity region and the second contact plug are formed on either side of the second gate electrode.

* * * * *